(12) United States Patent
Fricke et al.

(10) Patent No.: US 6,687,147 B2
(45) Date of Patent: *Feb. 3, 2004

(54) CUBIC MEMORY ARRAY WITH DIAGONAL SELECT LINES

(75) Inventors: Peter Fricke, Corvallis, OR (US); Andrew L. Van Brocklin, Corvallis, OR (US); Andrew Koll, Albany, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 10 days.

This patent is subject to a terminal disclaimer.

(21) Appl. No.: 10/202,174

(22) Filed: Jul. 23, 2002

(65) Prior Publication Data

US 2003/0185049 A1 Oct. 2, 2003

Related U.S. Application Data

(63) Continuation-in-part of application No. 10/116,213, filed on Apr. 2, 2002, now Pat. No. 6,643,159.

(51) Int. Cl.[7] ............................. G11C 5/06; G11C 5/02
(52) U.S. Cl. ............................. 365/63; 365/51
(58) Field of Search ............................. 365/51, 67, 63, 365/130

(56) References Cited

U.S. PATENT DOCUMENTS

| | | | |
|---|---|---|---|
| 5,684,981 A | 11/1997 | Jones | |
| 5,835,396 A | * 11/1998 | Zhang | .......................... 365/51 |
| 6,004,825 A | * 12/1999 | Seyyedy | .......................... 438/3 |
| 6,166,986 A | 12/2000 | Kim | |
| 6,373,741 B2 | 4/2002 | Ferrant | |
| 6,400,642 B1 | 6/2002 | Mehrotra et al. | |
| 6,411,557 B2 | 6/2002 | Terzioglu et al. | |
| 6,418,063 B1 | 7/2002 | Seitsinger et al. | |
| 6,424,553 B2 | * 7/2002 | Berggren et al. | .............. 365/51 |

* cited by examiner

Primary Examiner—Van Thu Nguyen
Assistant Examiner—J. H. Hur (57) ABSTRACT

A method of creating a memory circuit preferably includes (1) forming a first plurality of select-lines in a plane substantially parallel to a substrate, (2) forming a second plurality of select-lines in a plane substantially parallel to the substrate, where the second plurality of select-lines is divided into first and second groups, where the first group is formed in a direction normal to that of the first plurality of select-lines and the second group is formed in a direction substantially diagonal to that of the first group, (3) forming a plurality of pillars normal to the substrate, and (4) forming an array of memory cells, each memory cell being respectively coupled to a pillar and one of each of said first and second pluralities of select-lines.

23 Claims, 7 Drawing Sheets

CUBIC MEMORY ARRAY WITH DIAGONAL SELECT LINES

RELATED APPLICATION

The present application is a continuation-in-part of previously-filed U.S. patent application Ser. No. 10/116,213, now U.S. Pat. No. 6,643,159 entitled "Cubic Memory Array," filed Apr. 2, 2002, which is incorporated herein by reference in its entirety.

FIELD OF THE INVENTION

The present invention relates to the field of electronic memory devices. More particularly, the present invention relates to a cubic memory array with select lines connected to multiple memory cells.

BACKGROUND OF THE INVENTION

Personal computers, servers, personal digital assistants, electronic games and other electrical devices use memory systems for storing data. An ever-increasing demand exists for larger and faster memory systems. Attributes of memory technologies include data access time (i.e. speed), cost, reliability, size (i.e. density), and electrical power dissipation.

Several memory technologies are widely used such as floppy drives, hard drives, compact disk (CD) drives and semiconductor memories. A semiconductor memory device is made up of a vast number of components called memory cells that each store a bit of data. Types of semiconductor memory include, for example, dynamic random access memory (DRAM), static random access memory (SRAM), read-only memory (ROM), programmable read-only memory (PROM), one-time programmable (OTP), electrically erasable programmable read-only memory (EEPROM), and video random access memory (VRAM).

To increase the density of a semiconductor memory device, it is usually necessary to increase the density of the memory cells. However, as the density of memory cells increases within a given memory technology, there is a proportional increase in the amount of control elements needed to control and access the individual memory cells. In most cases each individual memory cell must have multiple electronic lines or connections that provide access to that memory cell and control the operations performed using that memory cell.

The area used for control electronics limits the area available for other digital circuits or system functionality. Additionally, increasing the amount of control elements may necessitate additional process layers so as to be able to fit a functioning memory cell and the required control elements in a given area. This adds to the time and money required to fabricate a memory array.

SUMMARY OF THE INVENTION

In one of many possible embodiments, the present invention provides a method of creating a memory circuit by (1) forming a first plurality of select-lines in a plane substantially parallel to a substrate, (2) forming a second plurality of select-lines in a plane substantially parallel to the substrate, where the second plurality of select-lines is divided into first and second groups, where the first group is formed in a direction normal to that of the first plurality of select-lines and the second group is formed in a direction substantially diagonal to that of the first group, (3) forming a plurality of pillars normal to the substrate, and (4) forming an array of memory cells, each memory cell being respectively coupled to a pillar and one of each of said first and second pluralities of select-lines.

Additional advantages and novel features of the invention will be set forth in the description which follows or may be learned by those skilled in the art through reading these materials or practicing the invention. The advantages of the invention may be achieved through the means recited in the attached claims.

BRIEF DESCRIPTION OF THE DRAWINGS

The foregoing and other features and aspects of the invention will become further apparent upon reading the following detailed description and upon reference to the drawings in which.

Throughout the drawings, identical reference numbers designate similar, but not necessarily identical, elements.

DETAILED DESCRIPTION OF THE PREFERRED EMBODIMENTS

In one of many possible embodiments, the present invention provides a three-dimensional (3D) memory architecture that utilizes vertical pillars to form either the row or column lines used to select a particular memory cell within an array of memory cells. These pillars are shared in a manner that allows fewer switching elements to be used in the memory to access individual memory cells.

This architecture creates a 'cubed' array structure out of a stack of memory cells that is very volumetrically space efficient, conserves space for additional circuit elements, and is easier to manufacture than previous 3D-architectures that simply expand conventional cross-point memory arrays by stacking them. Further, the space saved by the common sense lines and shared switching elements can allow space under the memory array to be used for other circuit elements or allow a lower layer count in the manufacturing process.

For purposes of clarity in describing the invention in this application, the lines connecting the array of memory cells in a vertical direction with respect to the plane of the substrate on which the memory cells are disposed will be referred to as pillars. The select lines connected to the pillars will be referred to as bit-lines. The select lines connected to the memory cells, as opposed to the pillars, will be referred to as word-lines.

A cubic memory array, according to principles of the present invention, is particularly useful for embedded designs because it can be embedded with conventional]

integrated circuits such as microprocessors, graphic processors, and storage processors. Because a memory array of the present invention requires fewer switching elements and can locate those control elements around the periphery of the memory cell array, the present invention allows additional circuit elements to be fabricated below the memory array on the base substrate.

A cubic memory array of memory cells can be created according to principles of the present invention using any of a variety of semiconductor devices as the storage and control elements of the array. Most implementations of the 3D-architecture will be performed using conventional semiconductor equipment and silicon substrates as starting materials. However, the semiconductor devices of the present invention are applicable to a broad range of semiconductor technologies and can be fabricated from a variety of semiconductor materials.

Figure 1:
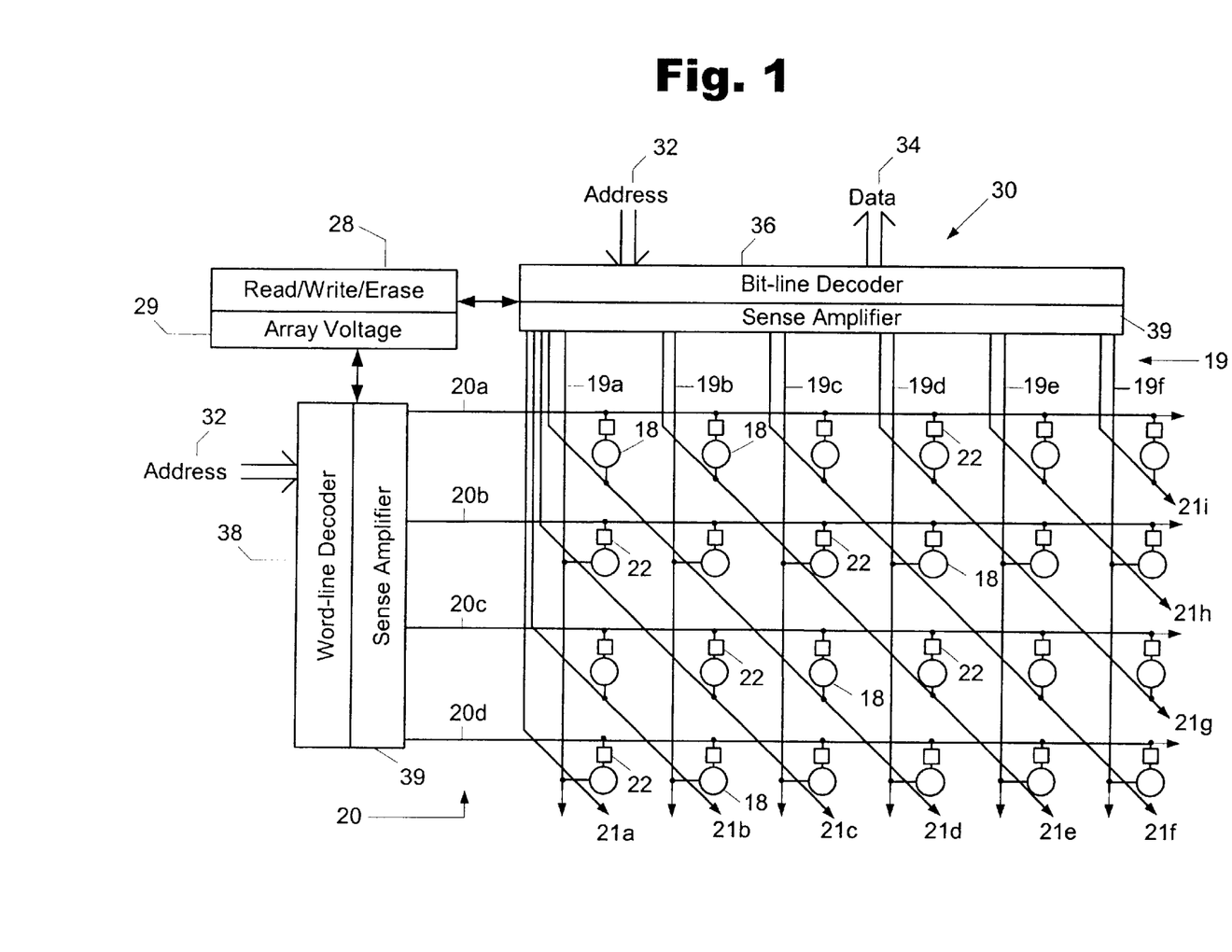
FIG. 1 is a schematic of a memory array for a shared sense line memory array according to one embodiment of the present invention.

FIG. 1 is a schematic diagram of a memory circuit (30) in which a number of two-dimensional arrays of memory cells (22) are stacked vertically to form a three-dimensional, cubic memory array according to an embodiment of the present invention. Each memory cell (22) includes at least one storage element, usually configurable in an "on" or "off" state, or containing charge that represents an "on" or "off" state. Alternatively, memory cells (22) may also store multiple states, or charges that represent multiple states, so that more than one bit of information is stored per memory cell (22).

FIG. 1 illustrates part of a two-dimensional layer of the cubic memory array. The section shown is a 6×4 memory cell array arranged in rows and columns with supporting electronics. Each memory cell (22) in the stacked configuration is connected to one of a set of word-lines (20a–20d), which run along the rows of memory cells (22), and one of a set of bit-lines (19a–f, 21a–i), which may be disposed along the columns of memory cells (22) or diagonally across the columns of memory cells (22).

A different set of word-lines (20a–20d) is provided at each level of the cubic memory array for the memory cells (22) of that level. The connection between each memory cell (22) and one of the bit-lines (19a–f, 21a–i) is made through one of the conductive pillars (18). A set of bit-line (19a–f, 21a–i) is not disposed at each level of the cubic array. Rather, the bit-lines (19a–f, 21a–i) are preferably disposed outside the array of memory cells and connected to the memory cells (22) through pillars (18) that extend through the array of memory cells. The pillars (18) extend through the layers of memory cells (22) and normal to a base substrate on which the cubic memory array is formed. Thus, each memory cell (22) is connected to one of the pillars (18). A number of memory cells (22) at different levels in the cubic array share, and are connected to, each one of the pillars (18). The pillars (18) then provide the connection between each memory cell (22) and one of the bit-lines (19a–f, 21a–i).

As indicated above, the bit-lines (19, 21) are preferably disposed in two groups. One set of bit-lines (19) is preferably arranged perpendicular in direction to the word-lines (20), i.e., along a column of memory cells (22). A second set of bit-lines (21) is preferably arranged diagonally across the pillars (18) and corresponding stacked memory cells (22), e.g., at a 45° physical angle. Hereinafter, the second set of bit-lines will be referred to as the diagonal bit-lines (21).

A cubic array for the purposes of this disclosure is defined as memory cells arrayed in three dimensions. The three dimensions of the array may be of different lengths, such that an actual "cube" is not formed. However, "cubic" is used herein in its broader meaning of "having three dimensions" to refer to the basic three-dimensional structure of the memory array. Actual dimension lengths will vary depending on the designer choice for the number of memory cells per plane and the number of planes to be stacked.

In the case of a memory array that is truly cubic, meaning that the memory cell count is equal along all sides, the angle at which the diagonal bit-lines (21) is disposed is preferably a 45° angle. However, the angle used can be any angle that allows each pillar (18) within the memory array to be connected to either set of bit-lines (19, 21).

The first set of bit-lines (19) and the second set of bit-lines (21) are preferably arranged in different planes. For example, one set of bit-lines may be above the cubic memory array, while the other set is arranged below the cubic memory array. This configuration can be seen, for example, in FIG. 2.

The diagonal bit-lines (21) are arranged diagonally to reduce the noise that might be induced by the other set of bit-lines (19). This decreases the cross talk received from the bit-lines (19, 21). The output of the bit-lines (19, 21) is received by a sense amplifier (39), which will be described in more detail below. By having the bit-lines (19,21) and pillars (18) arranged in horizontal and vertical planes, respectively, the capacitance between the pillars (18) and bit-lines (19, 21) is reduced. This reduced capacitance allows for faster access speeds for the memory array (30).

Each pillar (18) and the memory cells (22) that pillar connects to are, in turn, connected to either a bit-line (19) or to a diagonal bit-line (21). Each of the two types of bit-lines preferably intersects every other pillar (18) to maintain isolation between pillars (18) that are also sharing a common row/pillar connect. This configuration allows each pillar (18), and the memory cells (22) connected to that pillar, to be accessed individually by the corresponding word-line (20) and a bit-line (19,21).

Shown at the perimeter of the memory array is the control circuitry for the memory circuit (30). This control or switching circuitry controls the bit-lines (19,21) and word-lines (20) and their access to individual memory cells (22). More particularly, the control circuitry controls information coming into, and going out of, the memory array (30), how each memory cell (22) is accessed, how the information contained in the memory cell (22) is amplified and decoded in read/write/erase cycles, how voltage levels are applied, and how the sense lines are controlled.

The control circuitry includes sense amplifiers (39) that are used to control individual word-lines (20) and bit-lines (19,21). The sense amplifiers (39) may be any element that allows a signal to be amplified as needed in the read/write/erase cycle of the memory array (30). The sense amplifiers (39) are preferably constructed using transistors or diodes, but may use any elements that allow an electronic signal or voltage level to be amplified.

A word-line decoder (38) and bit-line decoder (36) are used to logically determine which row (20) and bit-line (19,21) to drive to access an individual memory cell (22). The word-line decoder (38) and bit-line decoder (36) may be any combination of multiplexers, decoders, and other logic that allows the decoders (38,36) to receive a memory location from a corresponding address bus (32) and decode that information to drive the appropriate row (20) and bit-lines (19,21) to access the required memory cells (22). In a read operation, the information accessed from the memory cells (22) is then decoded and sent out of the bit-line decoder (36) through a data bus (34).

Array voltage circuitry (29) works in conjunction with read/write/erase circuitry (28) to control the voltage levels applied through the decoders (38,36) and sense amplifiers (39) to the memory cells (22) of the array. Different voltage levels are used for the read, write, and erase cycles completed by the memory circuit (30). The array voltage circuitry (29) contains a voltage source that allows varying levels of voltage to be applied to the lines. The read/write/erase circuitry (28) controls the timing of each cycle and when and how the voltage levels of the applied voltage array circuitry (29) are applied.

The memory circuitry (30) works to run each element previously described. A more descriptive account of the interaction between elements is given below. The memory circuitry (30) is connected to a set of external address lines forming an address bus (32) and data lines forming a data bus (34). The address lines (32) signal a location in an encoded form (preferably binary) for selecting a particular memory cell (22) in the array of memory cells to address.

The word-line decoder (38) interprets the address from the address bus (32) to decide in which row or word-line the particularly selected memory cell (22) is located. Typically, only one word-line is selected and driven to a predetermined voltage level and the other, non-selected word-lines are typically driven to a ground level. These voltage levels are applied through the word-line decoder (38) by the array voltage circuitry (29). The word-line decoder (38) and the bit-line decoder (36) contain circuitry that allows individual access lines to be multiplexed for read, write, erase, and standby cycles for each memory cell (22).

The bit-line decoder (36) also uses the signal from the address bus (32) to select a particular bit-line (19,21) to drive. A corresponding memory cell (22) is then accessed for a read/write/erase operation. A reading operation may involve using the active bit and word-lines to sense the state of the selected memory cell (22) through the corresponding sense amplifiers (39). The memory circuit (30) also includes read/write/erase circuitry (28) that, along with the array voltage circuitry (29), is connected to the word-line decoder (38) and the bit-line decoder (36). The read/write/erase circuitry (28) provides the appropriate voltages and timing to the selected and deselected individual memory cells (22) during each operation. It should be noted that the erase operation might not be available on all types of memory circuits (30).

The common bit-line architecture employed in embodiments of the present invention allows multiple pillars (18) to be accessed for parallel read and write operations. Similarly, dual read and write operations can occur simultaneously for non-conflicting pillars (18). Thus, the embodiments of the present invention can provide for the simultaneously accessing and controlling a plurality of memory cells. The present invention also facilitates the removal of control circuitry (e.g., 36, 38, 39) to the periphery of the memory array making area available on the substrate of the memory array (30) underneath the array of memory cells for additional circuit elements. Also inherent in the invention is the ability to manufacture a memory array (30) directly on top of a substrate therefore reducing process layer steps and the overall cost of cubic memory array manufacturing.

Figure 2:
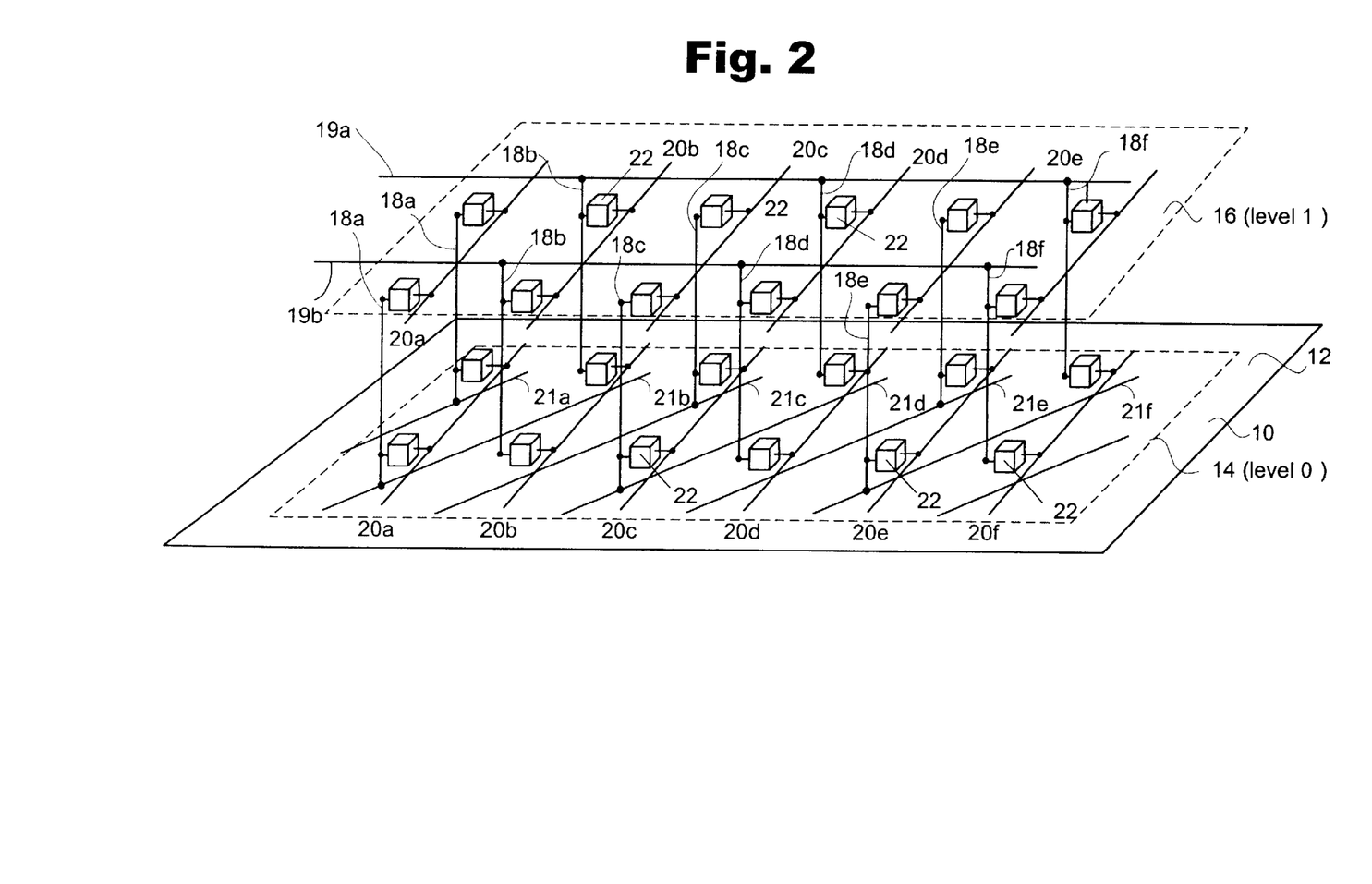
FIG. 2 is a schematic diagram of the physical layout of a shared sense line memory array according to one embodiment of the present invention.

FIG. 2 is an exemplary physical layout that illustrates one possible embodiment of a cubic memory array according to the present invention. As shown in FIG. 2, the cubic memory array is formed from stacked memory cells (22) and corresponding pillars (18) that run between memory cell levels. In this example, two levels (or alternatively two planes) of memory cells (22) are shown. These two levels are formed, one upon the other. The planes shown, Level 0 (14) and Level 1 (16), represent just two of many possible planes within a cubic memory array. The memory cells (22) of each level are preferably substantially aligned with the memory cells (22) in the adjacent level. Level 0 (14) includes diagonal bit-lines (21). Level 1 (16) includes non-diagonal bit-lines (19). Level 0 (14) and level 1 (16) are preferably formed in respective planes that are substantially parallel to a substrate surface (10).

In the two levels of memory cells (22) shown, word-lines (20a–f) are shown connecting the memory cells (22) in rows perpendicular in direction to the non-diagonal bit-lines (19). Each level (14, 16) includes its own set of word-lines (20). The word-lines (20) are preferably disposed in different planes from those of the bit-lines (19, 21).

Pillars (18) are formed preferably orthogonal to the substrate (10). Each bit-line (19,21) preferably forms a connection with every other pillar (18) along its length. The orientation chosen is for convenience in describing the present invention and the actual orientation of any embodiment is arbitrary. Other arrangements for selecting the organization of the word-lines and bit-lines into a cubic array exist and still meet the spirit and scope of the invention.

FIG. 2 shows a substrate (10), such as a silicon substrate (10), that is the base on which the memory array (30) is fabricated. The majority of currently available semiconductor devices are fabricated in and on silicon substrates (10). Consequently, applications of the present invention will preferably include silicon substrates (10). However, glass or polymer substrates, for example, could be used. The present invention may also advantageously employ gallium arsenide, germanium, plastic, cellulose and other semiconductor materials as substrate materials.

The silicon substrate (10) of FIG. 2 forms a planar surface (12) in and on which there may be formed the memory array control circuitry, for example, decoders, sense amplifiers, array voltage circuitry, multiplexers and/or other digital logic. The silicon substrate (10) may or may not be used for memory cells, which can be formed in layers on the substrate (10) as shown in FIG. 2. In some embodiments of the present invention the control or switching circuitry is preferably located at the periphery of the memory circuit allowing the silicon substrate (10) to be used for other circuit elements or for elements of the memory array itself. For example, FIG. 2 shows a first level (14) of memory cells (22) in a cubic memory array, where the memory cells (22) of the first level (14) are disposed on the planar surface (12) of the substrate (10).

The first memory level (14) has rows of memory cells (22) that are connected by word-lines (20) as shown. Disposed above the first memory level (14) is a second level (16) of memory cells (22). The memory cells (22) of the second level (16) are preferably substantially aligned with the memory cells (22) of the first memory level (14). By substantially aligning the memory cells (22), vertically aligned layers of memory cells may share a common interconnect, in this case they are connected by the pillars (18).

Figure 3:
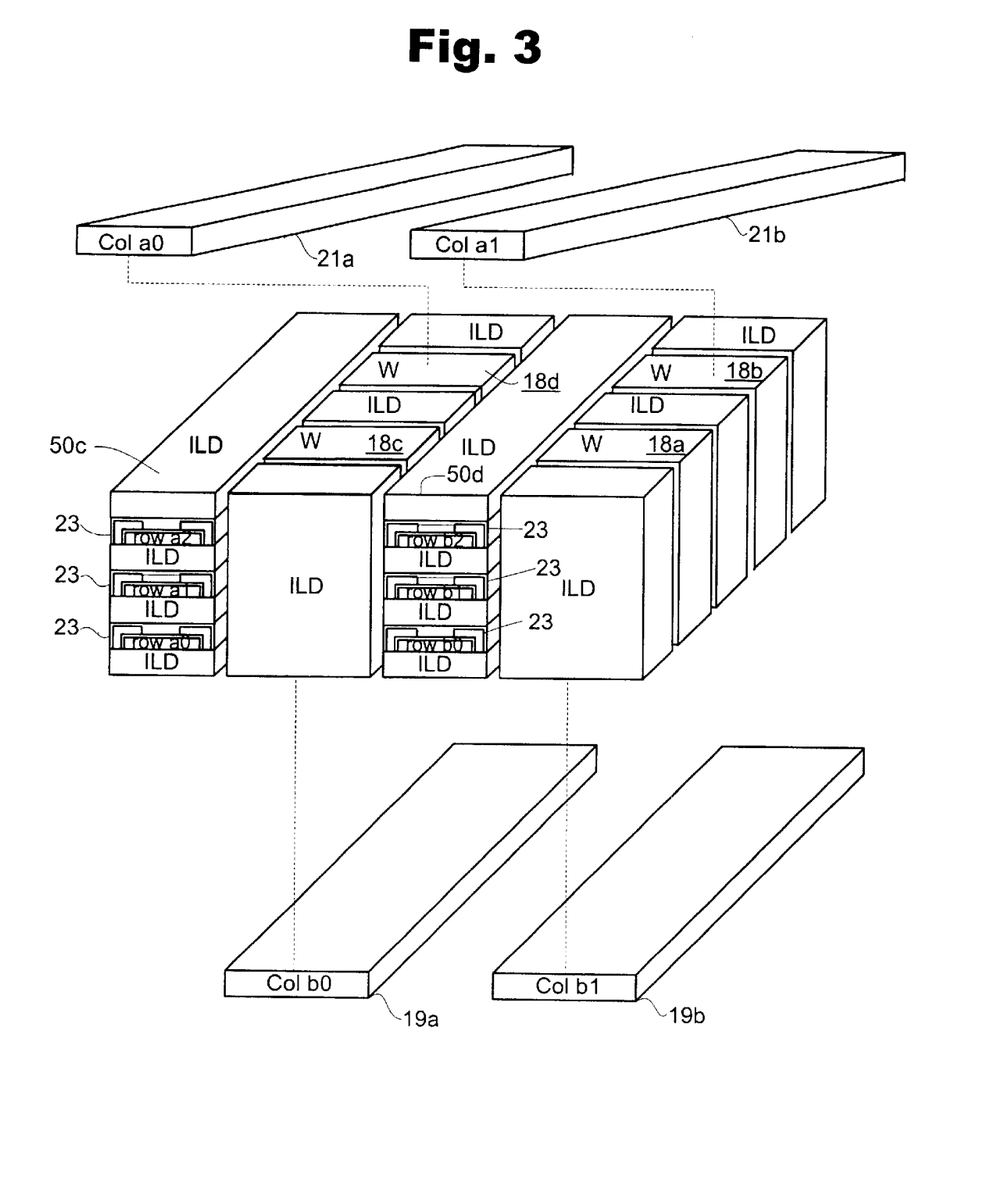
FIG. 3 is a partially exploded view of an embodiment of the present invention.

FIG. 3 is a partially exploded view of an alternative embodiment of the present invention. In this embodiment, non-diagonal bit-lines (19a, 19b) are formed within a substrate surface that defines a plane. Sets of memory cells (50c–d) that are formed in planes parallel to the plane of the substrate are disposed on the substrate. Vertical pillars (18a–18d) are formed in planes that are perpendicular to the plane of the substrate.

The pillars (18a–d) are adjacent to and make contact with the storage elements in the respective adjacent set of memory cells (50c–d). Optionally, the cubic memory array can be extended by adding an insulation layer dielectric (ILD) (not shown) on the set of memory cells and planarizing it to form a new substrate surface. On this planar surface, another set of diagonal bit-lines (21a, 21b) are disposed and are connected by vias into the top ILD layer to the respective vertical pillars (18b, 18d). Further sets of memory cells and pillars (18) are then optionally built upon the additional substrate surface. Because there is no ILD separating a pillar (18) from adjacent levels of memory cells, each pillar (18) is in contact with two storage elements (23) per layer The pillars (18a, 18c) make electrical contact with bit-lines col b0 (19a) and col b1 (19b). Additional pillars (18b, 18d) make electrical contact with diagonal bit-lines col a0 (21a) and col a1 (21b). In the embodiment of FIG. 3, there are three levels of memory cells (22) stacked vertically, one upon another. Depending on the particular fabrication processes used, it may be difficult to keep extending the vertically stacked layers of memory cells (22) due to non-planarity of the previously fabricated surface. Therefore, one approach to allowing for additional height is to create a layer of ILD (not shown) on top of the formed layers of memory cells. This layer of ILD is then planarized using, for example, a chemical mechanical planarization (CMP) technique or other known planarization techniques to form a new planar surface on which word-lines and another layer of memory cells can be built.

Figure 4:
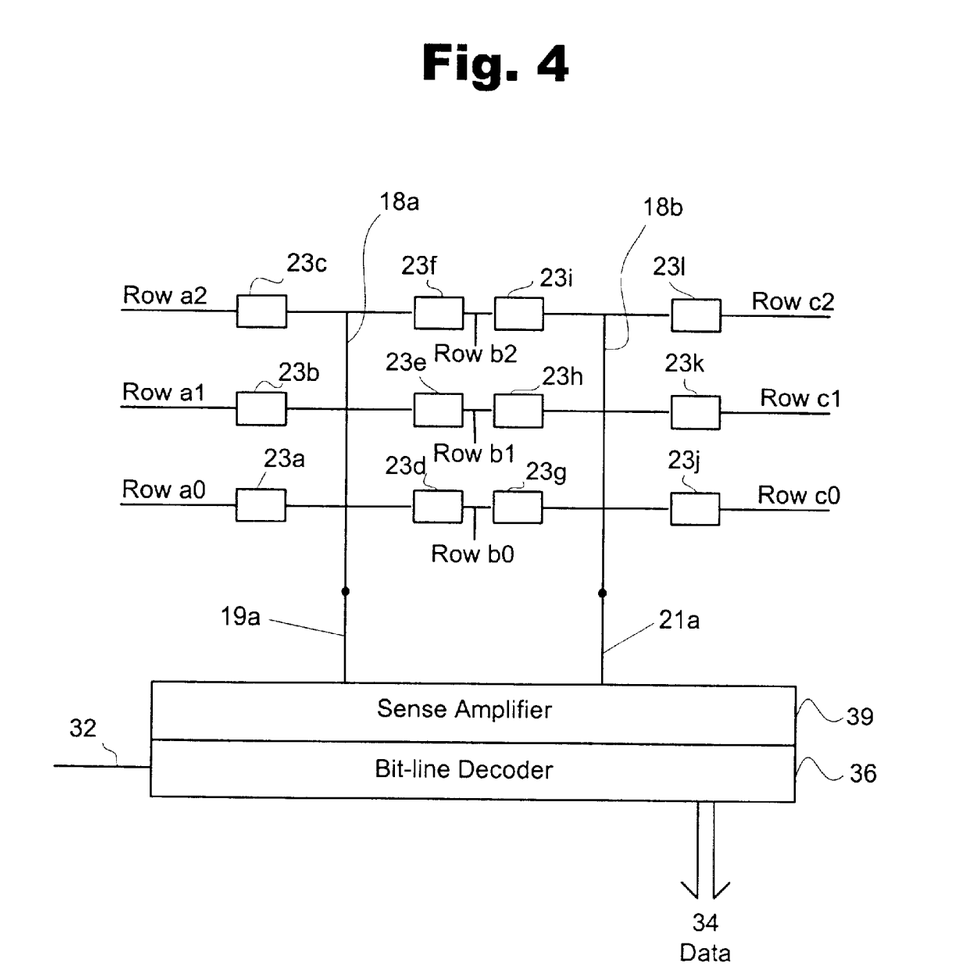
FIG. 4 is a partial schematic of an embodiment of the present invention using dual memory cells.

FIG. 4 shows a partial schematic of the memory cell connection to the word-lines and bit-lines of the word-line and bit-line decoders (38, 36; FIG. 1). Rows a(0–2), b(0–2), and c(0–2) are outputs from the word-line decoder and couple to dual memory cells 23(a–l). Vertical pillars (18a, 18b) connect to bit-lines (19a, 21a) these bit-lines (19a, 21a) then connect to sense circuitry or switching elements such as sense transistors or sense amplifiers (39), which are controlled and input into the bit-line decoder (36). Based on the contents of the inputs of the address bus (32) coupled into the bit-line decoder (36), the sensed data is output on a data bus (34).

Figure 5:
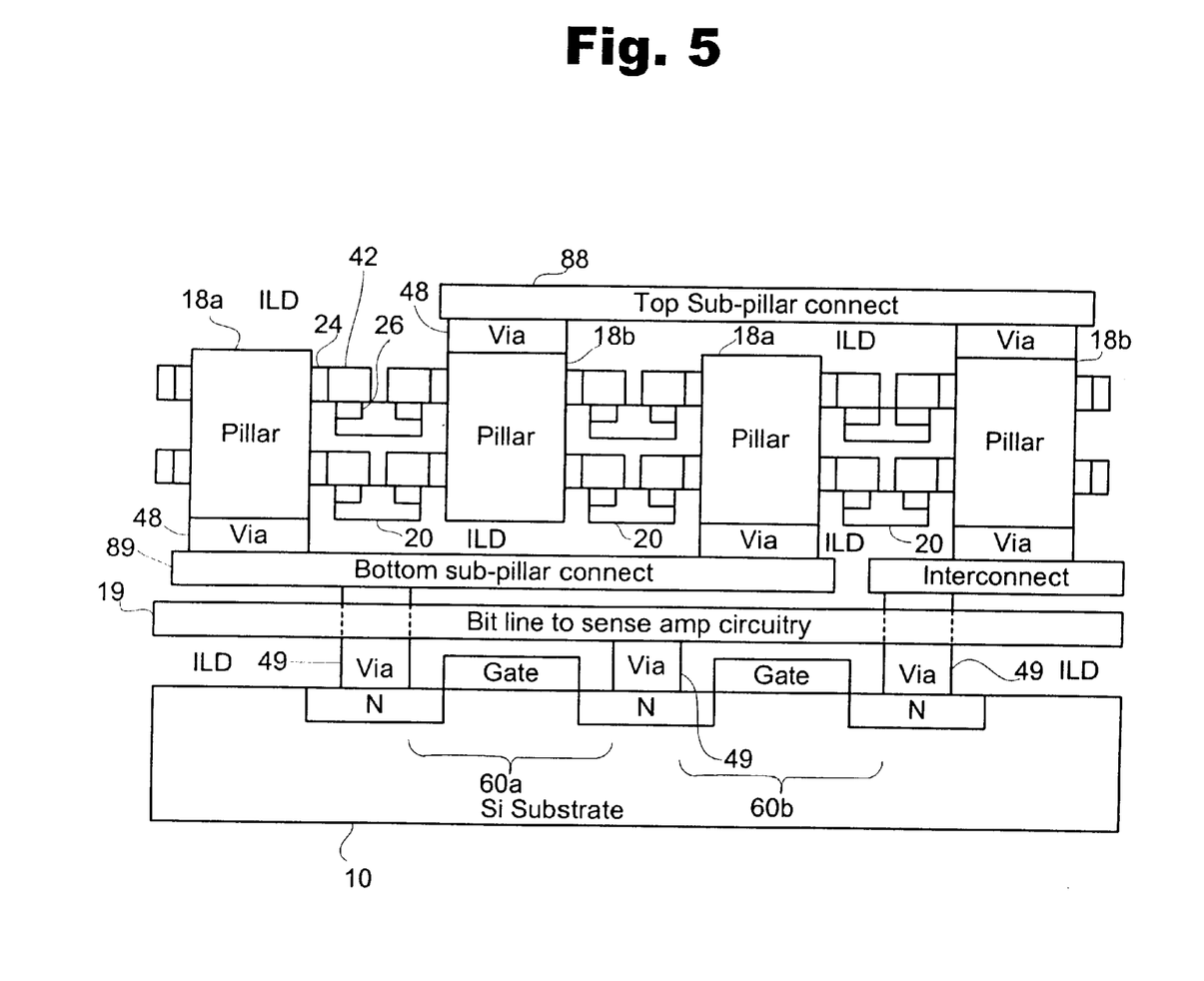
FIG. 5 is a side view of another embodiment of the present invention.

FIG. 5 is a sectional view of an embodiment of the present invention in which the pillars (18a, 18b) are interconnected by a top sub-pillar connect (88) and a bottom sub-pillar connect (89). The top (88) and bottom (89) sub-pillar connects couple to pillars (18a) and (18b) through vias (48). Because the pillars (18a, 18b) short the memory storage elements (24) on the respective sides of the pillar, only one storage element (24) per pillar can be accessed at one time. For that reason, every other pillar (18) is connected to a particular sub-pillar connect (88,89).

Preferably included in the formation of the cubic memory array is a control element (26) that is physically adjacent and has access to each storage element (24). The control element (26) is placed in series with the storage element (24) between the bit-lines (19,21) and the pillars (18).

Each of the memory cells has a storage element (24) in series with a control element (26) that is coupled in series through a middle electrode (42). One of the pillars (18a, 18b) is interconnected to a single bit-line (19) that is connected to the sense amp circuitry and the bit-line decoder (not shown). This connection is achieved by enabling one of transistors (60a, 60b) in the substrate (10) to select the desired pillar (18a, 18b).

The control circuitry may be fabricated in the substrate (10) of the memory array-using conventional semiconductor processing and can be implemented in various technologies, for example, a field effect transistors (FET). Alternatively, the control transistors can be replaced with other control elements such as diodes. Preferably, the control transistors or diodes are disposed substantially adjacent to the perimeter of the vertical memory array.

It is important to note that the bit-line configuration is interchangeable, either the non-diagonal bit-lines (19) or the diagonal bit-lines (21) may be used on top or bottom of the array. It may only be advantageous that they are not on the same level.

Figure 6:
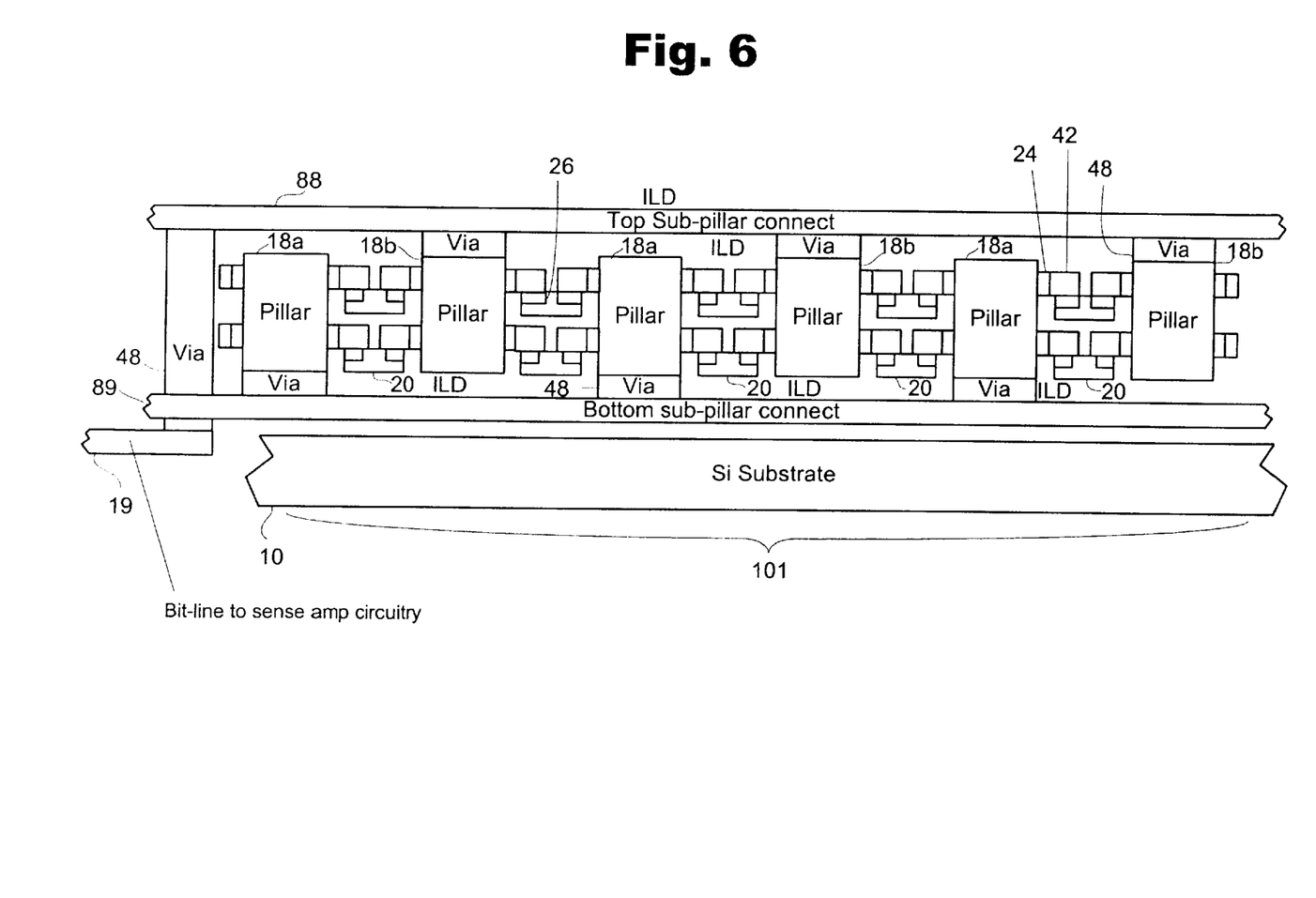
FIG. 6 is a side view of still another embodiment of the present invention.

FIG. 6 is a sectional view of an additional embodiment of the present invention similar to that of FIG. 5. A redundant explanation of elements already described in FIG. 5 will be omitted in describing FIG. 6.

Figure 7:
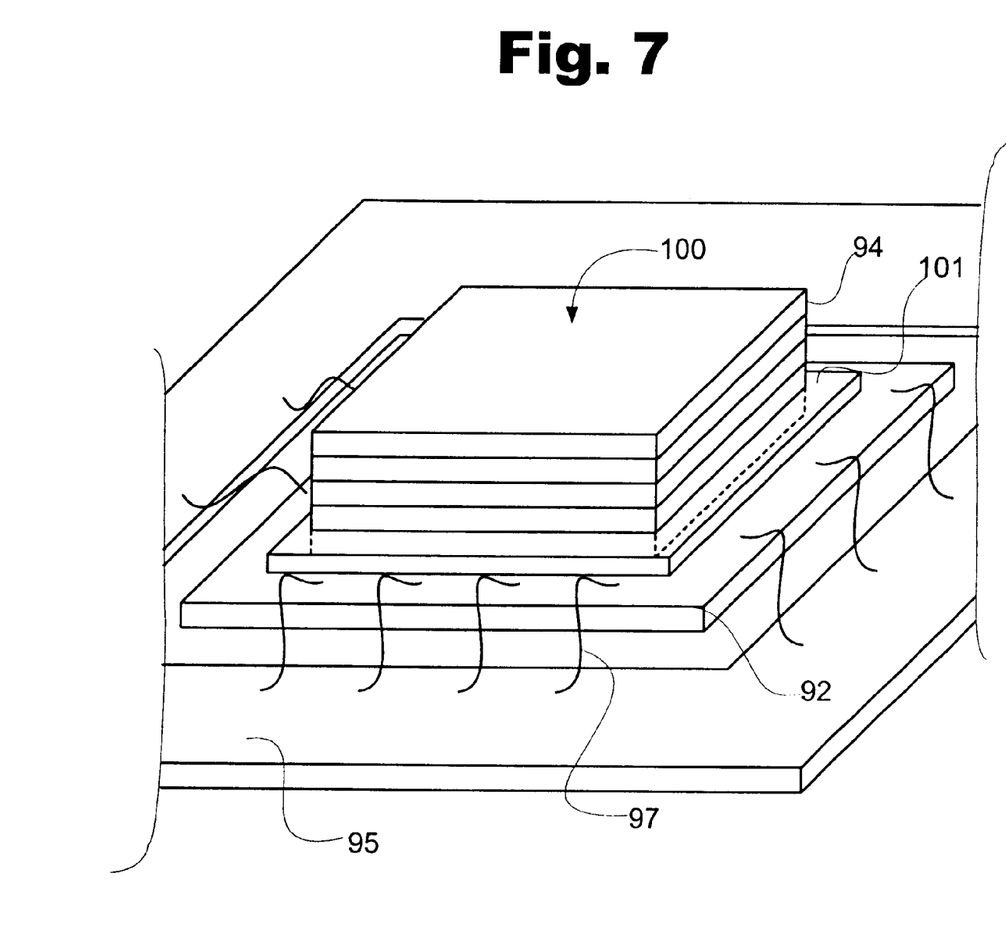
FIG. 7 is a partial perspective view of an embodiment of an embedded cubic memory array according to the present invention.

In FIG. 7, the sense control circuitry including, for example, decoders, sense amplifiers, read/write/erase circuitry, array voltage circuitry, multiplexers and other digital logic may be moved to the periphery of the memory array (not shown). The connections from the pillars (18) and to the corresponding bit-lines (19) are extended to the periphery of the memory array, this may be done by extending the sub-pillar connects (88,89). By removing the sense circuitry to the perimeter of the memory array, increased area is available for other circuit elements in the unoccupied portion of the substrate.

Consequently, the substrate area (101) made available may allow the first level of memory storage elements (24) to be manufactured directly on the substrate (10) in a reduced layer process. Alternatively, other circuitry for different system functionality can be formed on the substrate (10) below the memory array. The top sub-pillar connect (88) and the bottom sub-pillar connect (89) are connected with the pillars (18a, 18b). Every other pillar is connected to a bit-line (88,89) through vias (48), which in turn connect to the sense control circuitry and decoders as previously described.

FIG. 7 is an exemplary embodiment of an embedded cubic memory array (100) that integrates planes of memory cells (94) with an element or device that has an inherent need for memory. In one embodiment, the memory (100) is integrated with a microprocessor (92). The microprocessor (92) may use the planes of memory cells (94) as level 1 and/or level 2 cache memory. In an integration such as that shown, the embedded cubic memory array (100) is fabricated on top of the die of the microprocessor (92) thereby allowing the substrate of the memory array (101) to be used for microprocessor circuitry or other circuit elements allowing for a smaller total die area size.

The upper surface of the microprocessor (92) forms a horizontal substrate surface. Preferably, memory is built of one or more vertical layers of memory cells (94) on the microprocessor (92) to form the embedded cubic memory array (100). The memory cells are connected by a first and second set of select lines as described above. At least one set of the select lines is formed within the embedded cubic memory array (100) as pillars, as described above. The sets of select lines are electrically connected to selection circuitry formed around the periphery of the memory array (100) in the memory substrate (101) on the die of microprocessor (92).

The selection circuitry (101) at the periphery of the memory array (100) may contain some or all of sense amplifiers, decoders and decode logic, buffers, voltage generators, and read/write/erase control circuitry described above. This configuration allows the substrate to be fully utilized as previously mentioned. The microprocessor (92) is electrically attached to a package (95) such as with bonding wires (97) or tape automated bonding (TAB) circuit technology.

After the microprocessor is attached to package (95) it is encapsulated (not shown) to provide protection from contaminants and handling. Although the embedded cubic memory array (100) is shown as disposed on a microprocessor integrated circuit, those of skill in the art will appreciate that any integrated circuit that utilizes memory circuits can be substituted for the microprocessor (92). One example would be a graphics display controller.

The preceding description has been presented only to illustrate and describe the invention. It is not intended to be exhaustive or to limit the invention to any precise form disclosed. Many modifications and variations are possible in light of the above teaching.

The preferred embodiment was chosen and described in order to best illustrate the principles of the invention and its practical application. The preceding description is intended to enable others skilled in the art to best utilize the invention in various embodiments and with various modifications as are suited to the particular use contemplated. It is intended that the scope of the invention be defined by the following claims.

What is claimed is:

1. A cubic memory array, comprising:
   a plurality of memory cells arranged in arrays with rows and columns, said arrays being layered on a substrate;
   a plurality of conductive pillars, each conductive pillar being connected to a plurality of said memory cells and extending between layers of memory cells;
   a first plurality of select lines that are each connected to a plurality of said memory cells in a row; and
   a second plurality of select lines that are each connected to a plurality of said conductive pillars and are divided into first and second groups;
   wherein said first group is arranged diagonally among said conductive pillars.

2. The cubic memory array of claim 1, wherein each of said second plurality of select lines is connected to every other pillar along a length of that select line.

3. The cubic memory array of claim 1, further comprising control circuitry formed around a periphery of said cubic memory array, said control circuit selectively effecting reading and writing of data to said memory cells.

4. The cubic memory array of claim 3, wherein said control circuitry comprises a switching element electrically connected to at least one pillar.

5. The cubic memory array of claim 3, wherein a single switching element in said control circuitry simultaneously accesses and controls a plurality of select lines from both said first and second pluralities of select lines.

6. The cubic memory array of claim 3, wherein said control circuitry may simultaneously drive a plurality of said pillars that are connected to different select lines.

7. The cubic memory array of claim 1, wherein a first layer of said memory cells is formed directly on a surface of said substrate.

8. The cubic memory array of claim 1, further comprising circuitry formed on said substrate under said memory cells, pillars and select lines of said cubic memory array.

9. The cubic memory array of claim 1, wherein select lines of said first group are arranged diagonally at a 45 degree angle with respect to said rows and columns of said memory cells.

10. A method of creating a memory circuit, comprising:
    forming a first plurality of select-lines in a plane substantially parallel to a substrate;
    forming a second plurality of select-lines in a plane substantially parallel to said substrate, said second plurality of select-lines being divided into first and second groups, wherein said first group is formed in a direction normal to that of said first plurality of select-lines, and said second group is formed in a direction substantially diagonal to that of said first group;
    forming a plurality of pillars normal to said substrate; and
    forming an array of memory cells, each memory cell being respectively coupled to a pillar and one of each of said first and second pluralities of select-lines.

11. The method of claim 10, further comprising electrically connecting each of said second plurality of select lines to every other pillar along a length of that select line.

12. The method of claim 10, further comprising forming another layer of memory cells, disposed in an array, on said array of memory cells.

13. The method of claim 10, further comprising forming control circuitry around a periphery of said cubic memory array, said control circuit selectively effecting reading and writing of data to said memory cells.

14. The method of claim 13, wherein said forming said control circuitry comprises forming a switching element electrically connected to at least one pillar.

15. The method of claim 10, further forming circuitry on said substrate under said memory cells, pillars and select lines of said cubic memory array.

16. The method of claim 10, further comprising forming said memory circuit on an existing circuit formed on said substrate.

17. The method of claim 10, further comprising forming a first layer of said memory cells directly on a surface of said substrate.

18. A cubic memory array, comprising:
    storage means for storing digital data; and
    control means for reading and writing digital data in said storage means, said control means comprising a plurality of selection lines connected to memory cells in said storage means; and
    means for reducing cross-coupling between said selection lines.

19. The cubic memory array of claim 18, said control means further comprise a plurality of conductive pillars connected to said selection lines and said memory cells.

20. The cubic memory array of claim 19, wherein said means for reducing cross-coupling between said selection lines comprises disposing a first group of said selection lines above said conductive pillars and disposing a second group of said selection lines below said conductive pillars.

21. The cubic memory array of claim 18, said control means further comprise means for controlling a plurality of said selection lines with a single control element.

22. The cubic memory array of claim 18, wherein said control means access a plurality of said memory cells simultaneously.

23. The cubic memory array of claim 18, wherein said means for reducing cross-coupling between said selection lines comprises disposing a first group of said selection lines diagonal to a second group of said selection lines.

* * * * *